United States Patent
Rofougaran et al.

(10) Patent No.: US 7,796,970 B2
(45) Date of Patent: *Sep. 14, 2010

(54) INTEGRATED LOW NOISE AMPLIFIER

(75) Inventors: Rozieh Rofougaran, Marina Del Rey, CA (US); Jesus A Castaneda, Los Angeles, CA (US); Hung Yu David Yang, Los Angeles, CA (US); Lijun Zhang, Los Angeles, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/747,966

(22) Filed: May 14, 2007

(65) Prior Publication Data

US 2007/0213027 A1 Sep. 13, 2007

Related U.S. Application Data

(63) Continuation of application No. 10/943,382, filed on Sep. 17, 2004, now Pat. No. 7,218,909, which is a continuation of application No. 10/128,193, filed on Apr. 23, 2002, now Pat. No. 6,809,581.

(51) Int. Cl.
*H04B 1/28* (2006.01)

(52) U.S. Cl. ............... 455/333; 455/338; 455/326; 455/323

(58) Field of Classification Search ............... 455/333, 455/338, 326, 78, 334, 323, 118, 231.1, 292, 455/550.1, 73, 252.1, 321, 341, 313, 257.1; 330/252, 261

See application file for complete search history.

(56) References Cited

U.S. PATENT DOCUMENTS

| | | | |
|---|---|---|---|
| 6,100,759 A * | 8/2000 | Sirna et al. | 330/252 |
| 6,707,367 B2 * | 3/2004 | Castaneda et al. | 336/200 |
| 6,850,746 B1 * | 2/2005 | Lloyd et al. | 455/272 |
| 7,035,611 B2 * | 4/2006 | Garlepp et al. | 455/269 |
| 7,106,232 B2 * | 9/2006 | Harberts et al. | 341/139 |
| 7,218,909 B2 * | 5/2007 | Rofougaran et al. | 455/333 |
| 2003/0114129 A1 * | 6/2003 | Jerng | 455/323 |
| 2003/0148751 A1 * | 8/2003 | Yan et al. | 455/318 |
| 2004/0207504 A1 * | 10/2004 | Yang et al. | 336/223 |

* cited by examiner

*Primary Examiner*—John Lee
(74) *Attorney, Agent, or Firm*—Garlick Harrison & Markison; Kevin L. Smith

(57) ABSTRACT

An integrated circuit (IC) low noise amplifier includes an on-chip balun and an on-chip differential amplifier. The on-chip balun is coupled to convert a single-ended signal into a differential signal. The on-chip differential amplifier is coupled to amplify the differential signal.

12 Claims, 5 Drawing Sheets

IC LNA 72

IC LNA 72

INTEGRATED LOW NOISE AMPLIFIER

This patent is claiming priority under 35 USC §120 as a continuation patent application to patent application entitled AN INTEGRATED CIRCUIT LOW NOISE AMPLIFIER, having a Ser. No. 10/943,382, filed Sep. 17, 2004, now issued as U.S. Pat. No. 7,218,909, on Sep. 17, 2004, which is a continuation patent application to the patent application entitled "AN INTEGRATED CIRCUIT LOW NOISE AMPLIFIER AND APPLICATIONS THEREOF", having a Ser. No. 10/128,193, and a filing date of Apr. 23, 2002, which is now issued as U.S. Pat. No. 6,809,581, on Oct. 26, 2004, all of which are hereby incorporated by reference herein for all purposes.

TECHNICAL FIELD

This invention relates generally to communication systems and more particularly to radio receivers used within such communication systems.

BACKGROUND

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or multiple channels (e.g., one or more of the plurality of radio frequency (RF) carriers of the wireless communication system) and communicate over that channel. For indirect wireless communications, each wireless communication device communicates directly with an associated base station (e.g., for cellular services) and/or an associated access point (e.g., for an in-home or in-building wireless network) via an assigned channel, or channels. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, demodulates the RF carrier frequency from the RF signals via one or more intermediate frequency stages to produce baseband signals, and demodulates the baseband signals in accordance with a particular wireless communication standard to recapture the transmitted data. The transmitter converts data into RF signals by modulating the data in accordance with the particular wireless communication standard to produce baseband signals and mixes the baseband signals with an RF carrier in one or more intermediate frequency stages to produce RF signals.

To recapture data from RF signals, a receiver includes a low noise amplifier, down conversion module and demodulation module. For radio frequency integrated circuits, it is desirable to provide the low noise amplifier with differential RF signals instead of single ended RF signals to improve noise performance and common mode rejection. To convert received single ended RF signals into differential RF signals, a receiver includes a balun (i.e., a balanced/unbalanced transformer).

Until recently, the baluns were off-chip, i.e., on the printed circuit board, and were typically implemented in the form of micro-strip lines. Recent attempts to integrate a balun onto a radio frequency integrated circuit have had limited success. For example, parallel winding, inter-wound winding, overlay winding, single planar, square wave winding, and concentrical spiral winding on-chip baluns have been tried with limited success. Each of these on-chip baluns suffers from one or more of: low quality factor, (which causes the balun to have a relatively large noise figure); too low of a coupling coefficient (which results in the inductance value of the balun not significantly dominating the parasitic capacitance making impedance matching more complex); asymmetrical geometry (which results in degradation of differential signals); and a relatively high impedance ground connection at the operating frequency.

Therefore, a need exists for an integrated low noise amplifier that includes a symmetrical balun that has a low noise figure, low ground impedance at the operating frequency and has an inductance value that is dominant at the operating frequency.

SUMMARY

The integrated circuit low noise amplifier disclosed herein substantially meets these needs and others. In one embodiment, an integrated circuit (IC) low noise amplifier includes an on-chip balun and an on-chip differential amplifier. The on-chip balun is operably coupled to convert a single-ended signal into a differential signal. The on-chip differential amplifier is operably coupled to amplify the differential signal.

In another embodiment, an integrated circuit (IC) radio receiver includes a low noise amplifier, a down conversion module, and a filtering module. The low noise amplifier is operably coupled to amplify a radio frequency (RF) signal to produce an amplified RF signal. The down conversion module is operably coupled to convert the amplified RF signal into a baseband signal. The filtering module is operably coupled to filter the baseband signal. The low noise amplifier includes an on-chip balun operably coupled to convert a single-ended signal into a differential signal and an on-chip differential amplifier operably coupled to amplify the differential signal.

DETAILED DESCRIPTION THE DRAWINGS

Figure 1:
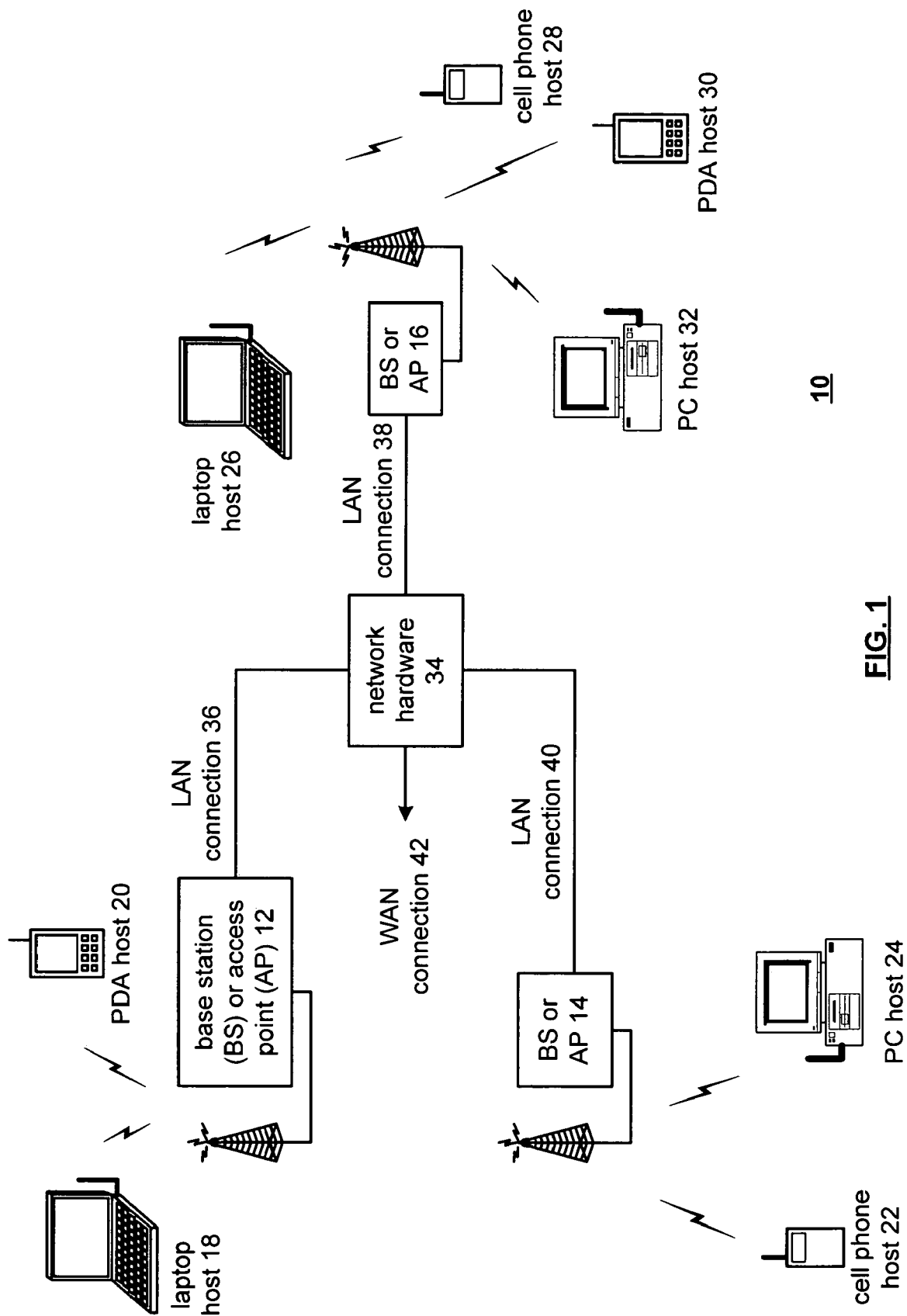
FIG. 1 illustrates a schematic block diagram of a wireless communication system in accordance with the present invention.

FIG. 1 illustrates a schematic block diagram of a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12 are operably coupled to the network hardware 34 via local area network connections 36, 38 and 40. The network hardware 34, which may be a router, switch, bridge, modem, system controller, et cetera provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes an integrated low noise amplifier as disclosed herein to enhance performance of radio frequency integrated circuits.

Figure 2:
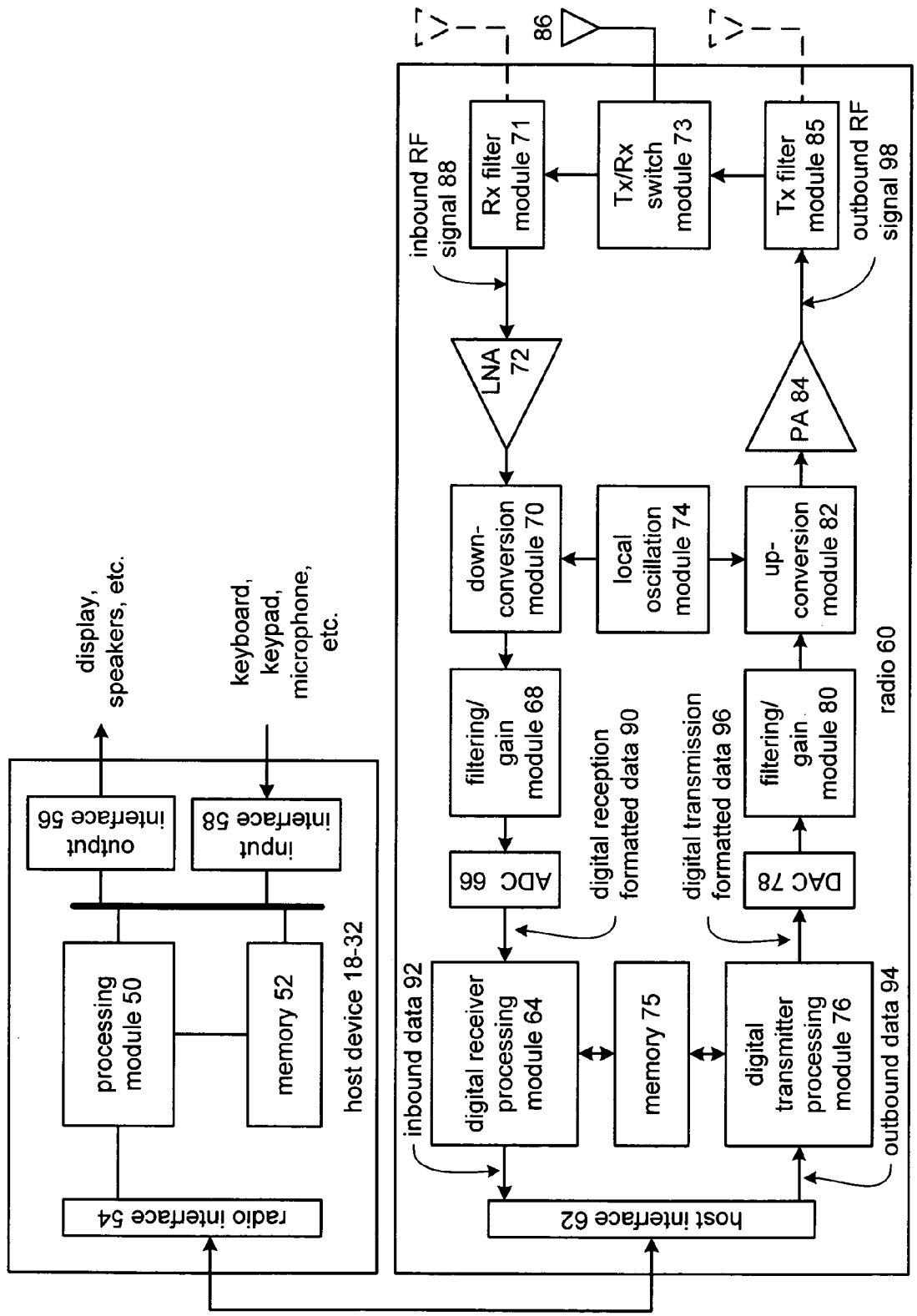
FIG. 2 illustrates a schematic block diagram of a wireless communication device in accordance with the present invention.

FIG. 2 illustrates a schematic block diagram of a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically done by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output display device such as a display, monitor, speakers, et cetera such that the received data may be displayed. The radio interface 54 also provides outbound data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, a receiver section, a transmitter section, local oscillation module 74, an antenna switch 73, and an antenna 86. The receiver section includes a digital receiver processing module 64, analog-to-digital converter 66, filtering/gain module 68, down conversion module 70, receiver filter module 71, low noise amplifier 72, and at least a portion of memory 75. The transmitter section includes a digital transmitter processing module 76, digital-to-analog converter 78, filtering/gain module 80, up-conversion module 82, power amplifier 84, transmitter filter module 85, and at least a portion of memory 75. The antenna 86 may be a single antenna that is shared by the transmit and receive paths via the antenna switch 73 or may include separate antennas for the transmit path and receive path and omit the antenna switch. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion. The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, et cetera) to produce digital transmission formatted data 96. The digital transmission formatted data 96 will be a digital base-band signal or a digital low IF signal, where the low IF will be in the frequency range of zero to a few megahertz.

The digital-to-analog converter 78 converts the digital transmission formatted data 96 from the digital domain to the analog domain. The filtering/gain module 80 filters and/or adjusts the gain of the analog signal prior to providing it to the up-conversion module 82. The up-conversion module 82 directly converts the analog baseband or low IF signal into an RF signal based on a transmitter local oscillation provided by local oscillation module 74. The power amplifier 84 amplifies the RF signal to produce outbound RF signal 98. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the low noise amplifier 72, which amplifies the signal 88 in accordance with the teachings of the present invention, which will be described in greater detail with reference to FIGS. 3-5, to produce an amplified inbound RF signal. The low noise amplifier 72 provide the amplified inbound RF signal to the down conversion module 70, which directly converts the amplified inbound RF signal into an inbound low IF signal based on a receiver local oscillation provided by local oscillation module 74. The down conversion module 70 provides the inbound low IF signal to the filtering/gain module 68, which filters and/or adjusts the gain of the signal before providing it to the analog to digital converter 66.

The analog-to-digital converter 66 converts the filtered inbound low IF signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the radio may be implemented a variety of ways to receive RF signals and to transmit RF signals and may be implemented using a single integrated circuit or multiple integrated circuits. Further, at least some of the modules of the radio 60 may be implemented on the same integrated circuit with at least some of the modules of the host device 18-32. Regardless of how the radio is implemented, the concepts of the present invention are applicable.

Figure 3:
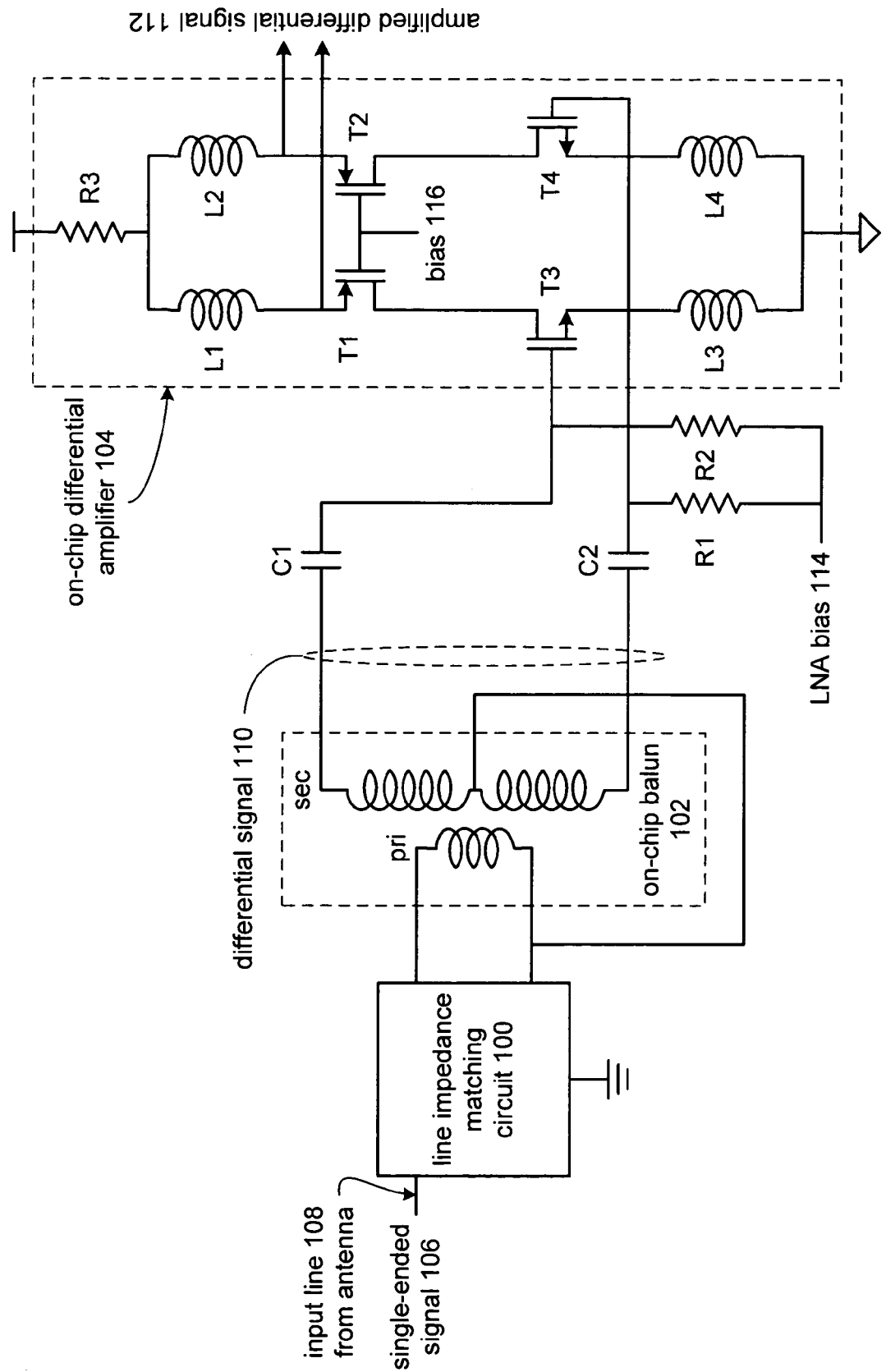
FIG. 3 illustrates a schematic block diagram of an integrated low noise amplifier in accordance with the present invention.

FIG. 3 illustrates a schematic block diagram of an integrated circuit low noise amplifier 72 that includes a line impedance matching circuit 100, an on-chip balun 102, and an on-chip differential amplifier 104. The line impedance matching circuit 100, which will be described in greater detail with reference to FIG. 4, receives a single ended signal 106 (e.g., a singled ended RF signal 88) via an input line 108 from the antenna. The line impedance matching circuit 100 provides an impedance, in conjunction with the primary winding of the balun 102, to substantially match the impedance of the antenna at the operating frequency, or frequencies, of the antenna. Typically, an antenna will have a 50 OHM impedance at the operating frequencies. Correspondingly, the line impedance matching circuit 100 in conjunction with the primary of the on-chip balun 102 will have an impedance of approximately 50 OHMS at the same frequencies.

The on-chip balun 102, which may be a symmetrical on-chip balun as described in co-pending patent application BP 2095 entitled ON-CHIP TRANSFORMER BALUN, having a filing date of Jan. 23, 2002, and a Ser. No. 10/055,425, now issued as U.S. Pat. No. 6,801,114, on Oct. 5, 2004. The primary winding of the on-chip balun is operably coupled to the line impedance matching circuit 100 to receive the single ended signal 106. The secondary is center tapped to produce a differential signal 110 from the single ended signal 106. The center tap connection is tied to one node of the primary, which in turn is coupled to the ground of the integrated circuit low noise amplifier 72, which may be done through a ground circuit that may be in the line impedance matching circuit or a separate circuit. While the on-chip balun 102 may have a noise figure that is greater than an off-chip balun, the noise figure of the on-chip balun 102 is reduced to more than acceptable levels by providing gain within the on-chip balun 102. For example, the on-chip balun may have a turns ratio of 2:9, where the center tap splits the nine turns of the secondary. To further improve the performance of the on-chip balun 102, the primary may include three shunted primary windings to minimize Ohmic losses.

The on-chip differential amplifier 104 is operably coupled to receive the differential signal 110 via AC coupling capacitors C1 and C2, which are sized to block low frequency signals and to pass high frequency signals. The on-chip differential amplifier 104 includes resistor R3, inductors L1, L2, L3 and L4, and transistors T1, T2, T3 and T4. Transistors T3 and T4 provide the differential input for the on-chip differential amplifier 104 and are biased in the linear region via resistors R1 and R2 to a low noise amplifier bias value 114. The design of transistor T3 in conjunction with the inductance of L3 is tuned to provide impedance matching with the output of the on-chip balun 102. Similarly, transistor T4 and inductor L4 are designed to provide impedance matching with the output of balun 102. Further, the inductors L3 and L4 have a relatively low Q, while transistors T3 and T4 have a large transconductance ($G_m$) value to provide a wide frequency range of operation while maintaining a relatively constant impedance. Still further, the parasitic capacitances of transistors T3 and T4 are sized with respect to the inductance values of L3 and L4 to have an insignificant contribution to the impedance of the input of the differential amplifier 104 at the operating frequencies. Transistors T1 and T2 are biased via a bias voltage 116. As configured, the on-chip differential amplifier 104 produces an amplified differential signal 112 from the differential signal 110.

Figure 4:
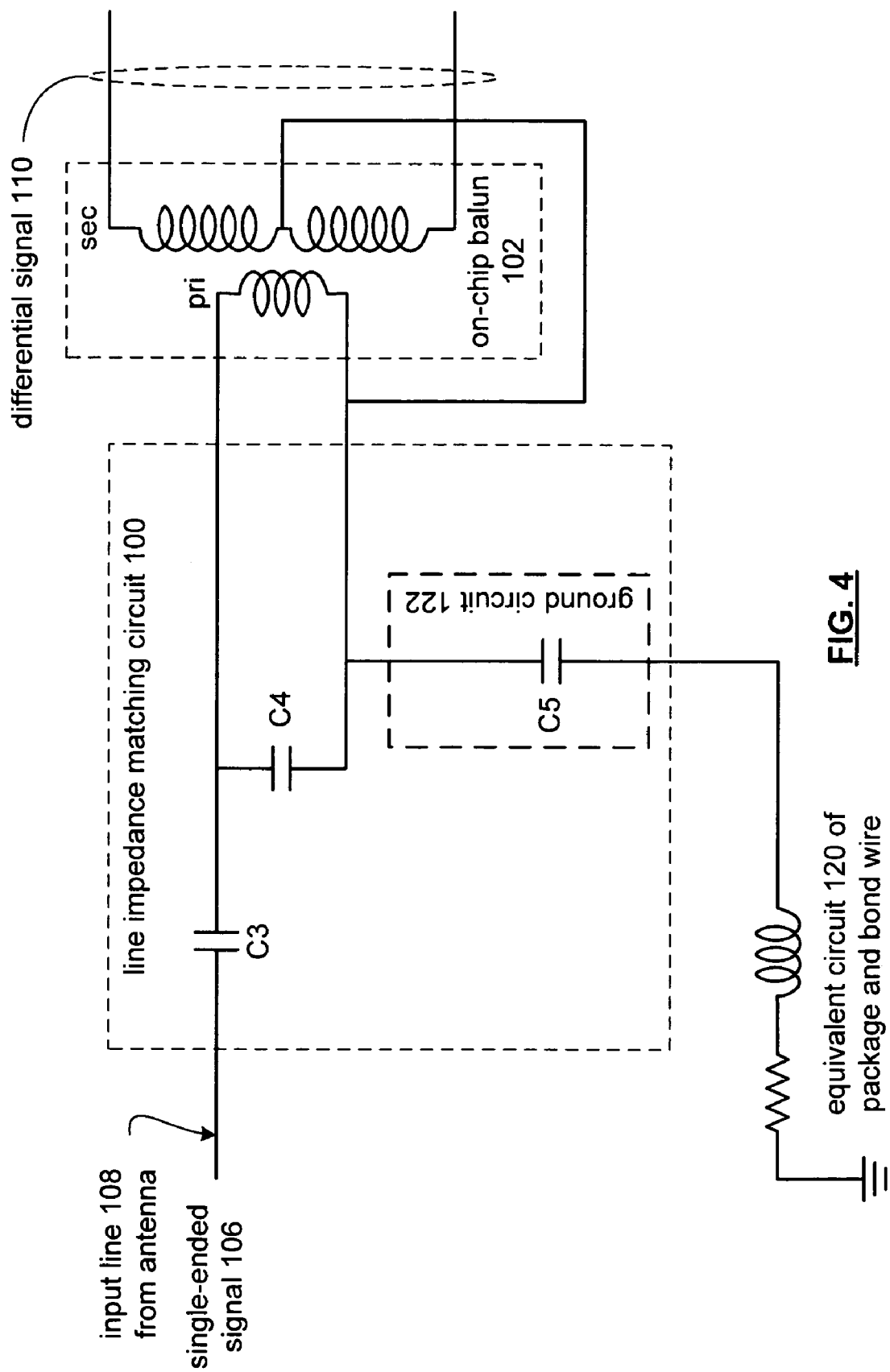
FIG. 4 illustrates a schematic block diagram of a line impedance matching circuit and on-chip balun in accordance with the present invention.

FIG. 4 illustrates a schematic block diagram of the line impedance matching circuit 100 and the on-chip balun 102. As shown, the line impedance matching circuit 100 includes capacitors C3 and C4 and a ground circuit 122. The ground circuit 122 may be implemented utilizing a capacitor C5. The capacitors C3 and C4 are tuned with respect to the inductance value of the on-chip balun to provide the desired input impedance at a particular operating frequency range for the IC low noise amplifier and, in addition, to provide gain. The particular operating frequency range may be from 2.4 gigahertz plus or minus 10%, 5.2-5.75 gigahertz plus or minus 10% and/or any other operating range that is used to transceive RF signals.

To simplify the impedance matching to include two capacitors, the on-chip balun 102 is designed such that its impedance at the operating frequencies is primarily determined by its inductances and not its parasitic capacitance. This is achieved by providing a sufficient coupling coefficient as further described in co-pending patent application entitled ON-CHIP TRANSFORMER BALUN, having a filing date of Jan. 23, 2002, and a Ser. No. 10/055,425, now issued as U.S. Pat. No. 6,801,114, on Oct. 5, 2004. If, however, the parasitic capacitance of the on-chip balun 102 is a significant factor at the operating frequencies, the line impedance matching circuit 100 would need to account for the impedance contributions of the parasitic capacitance.

The ground circuit 122, which includes capacitor C5, has a capacitance value such that, when coupled in series with the equivalent circuit 120 of the package and bond wire (which includes an inductor and resistor), the impedance at the operating frequencies is minimized. In particular, the capacitance value in combination with the inductance value of the bond wire and package provides a bandpass filter at the operating frequencies. As one of average skill in the art will appreciate, the ground circuit 122 may be implemented in a variety of ways to provide a low impedance path for the primary of the on-chip balun to ground.

Figure 5:
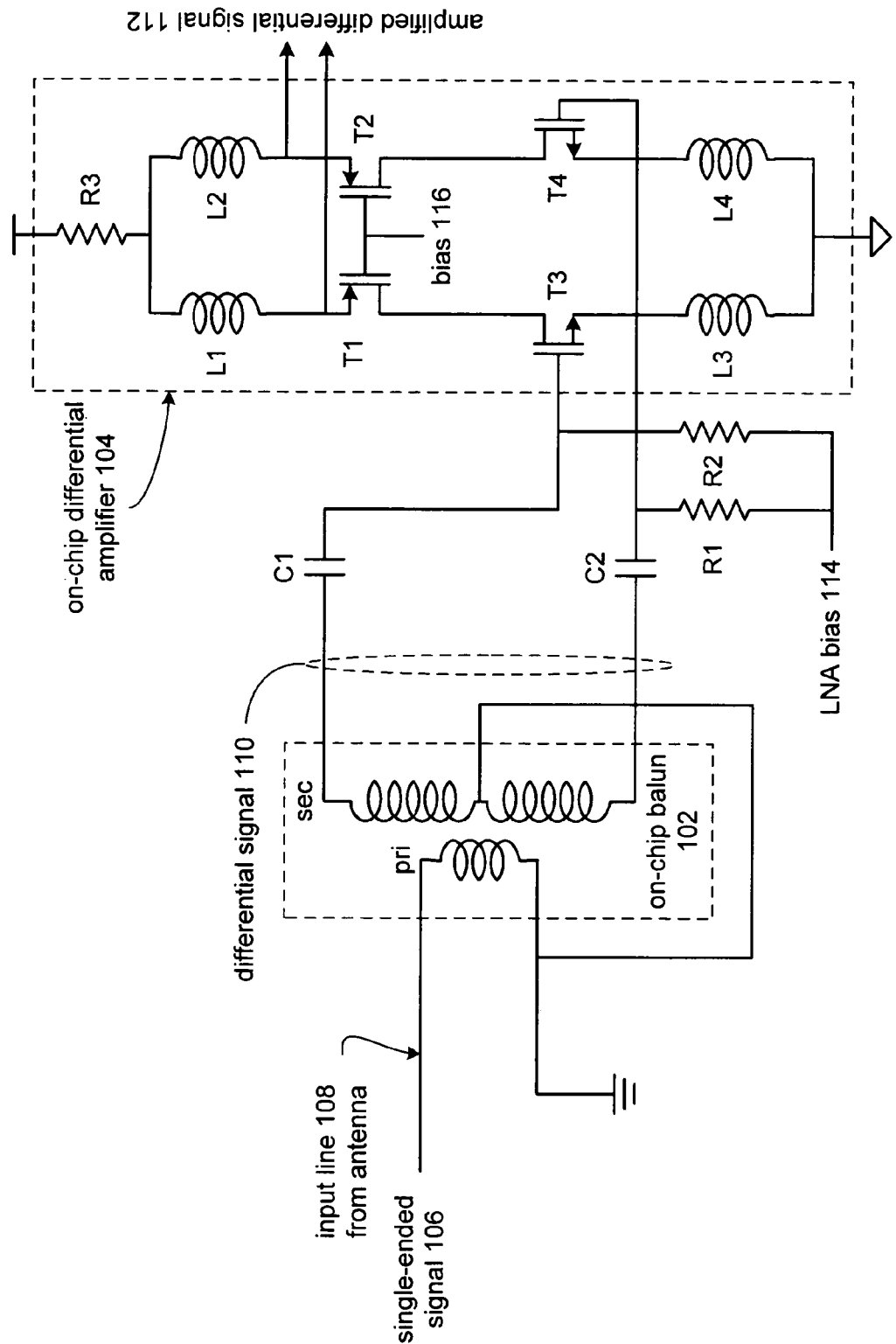
FIG. 5 illustrates an alternate embodiment of an integrated circuit low noise amplifier in accordance with the present invention.

FIG. 5 illustrates an alternate schematic block diagram of an integrated circuit low noise amplifier 72. In this embodiment, the integrated circuit low noise amplifier 72 includes an on-chip balun 102 and the differential amplifier 104. The on-chip balun 102 may be modified to include a ground circuit such that inductance and resistance of packaging and bond wires are compensated for such that a low impedance ground path is obtained. In addition, the on-chip balun 102 may be modified to include a line impedance matching circuit that includes a pair of capacitors, one coupled in series with the single ended signal 102 and another in parallel with the primary winding of the on-chip balun to provide impedance matching.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (for example, an item includes, but is not limited to, a component, an element, a circuit, and/or a module) where, for indirect coupling, the intervening item does not modify the information of a signal but may adjust its current level, voltage level, and/or power level. As may further be used herein, inferred coupling (that is, where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship. For example, when the desired relationship is that a first signal has a greater magnitude than second signal, a favorable comparison may be achieved when the magnitude of the first signal is greater than that of the second signal or when the magnitude of the second signal is less than that of the first signal.

The preceding discussion has presented an integrated circuit low noise amplifier and applications within a radio receiver. By incorporating an on-chip balun with a differential amplifier, an integrated circuit low noise amplifier that provides a low impedance ground path, symmetrical differential signaling, a low noise figure, substantial gain, and impedance matching is obtained. As one of average skill in the art will appreciate, other embodiments may be derived from the teaching of the present invention, without deviating from the scope of the claims.

What is claimed is:

1. An integrated circuit (IC) low noise amplifier comprises:
   on-chip balun coupled to convert a single-ended signal into a differential signal;
   on-chip differential amplifier coupled to amplify the differential signal; and
   line impedance matching circuit coupled to a primary of the on-chip balun to provide impedance matching for a line carrying the single-ended signal, the line impedance matching circuit includes a ground circuit coupled to the on-chip balun to compensate for bond wire and package inductance and resistance.

2. The IC low noise amplifier of claim 1, wherein the on-chip balun further functions to amplify the single-ended signal.

3. The IC low noise amplifier of claim 1, wherein the line impedance matching circuit further comprises:
   first capacitor coupled to receive the single-ended signal from the line and coupled to an input of the on-chip balun; and
   second capacitor coupled in parallel with the on-chip balun, wherein the first and second capacitors having capacitance values that, in combination with inductance of the on-chip balun, provide desired input impedance at a particular operating frequency range for the IC low noise amplifier and to provide gain.

4. The IC low noise amplifier of claim 3 further comprises:
   the on-chip balun having the inductance and a capacitance, wherein the inductance is dominant over the capacitance at the particular operating frequency range.

5. An integrated circuit (IC) radio receiver comprises:
   a low noise amplifier coupled to amplify a radio frequency (RF) signal to produce an amplified RF signal;
   down conversion module coupled to convert the amplified RF signal into a baseband signal; and
   filtering module coupled to filter the baseband signal, wherein the low noise amplifier includes:
      on-chip balun coupled to convert a single-ended signal into a differential signal;
      on-chip differential amplifier coupled to amplify the differential signal; and
      line impedance matching circuit coupled to a primary of the on-chip balun to provide impedance matching for a line carrying the single-ended signal, the line impedance matching circuit includes a ground circuit coupled to the on-chip balun to compensate for bond wire and package inductance and resistance.

6. The IC radio receiver of claim 5, wherein the on-chip balun further functions to amplify the single-ended signal.

7. The IC radio receiver of claim 5, wherein the line impedance matching circuit further comprises:
   first capacitor coupled to receive the single-ended signal from the line and coupled to an input of the on-chip balun; and
   second capacitor coupled in parallel with the on-chip balun, wherein the first and second capacitors having capacitance values that, in combination with inductance of the on-chip balun, provide desired input impedance at a particular operating frequency range for the IC low noise amplifier and to provide gain.

8. The IC radio receiver of claim 7 further comprises:
the on-chip balun having the inductance and a capacitance, wherein the inductance is dominant over the capacitance at the particular operating frequency range.

9. An integrated circuit (IC) low noise amplifier comprises:
a balun coupled to convert a single-ended signal into a differential signal;
a differential amplifier coupled to amplify the differential signal, wherein the balun and the differential amplifier are on-chip to form the IC low noise amplifier; and
line impedance matching circuit coupled to a primary of the on-chip balun to provide impedance matching for a line carrying the single-ended signal, the line impedance matching circuit includes a ground circuit coupled to the on-chip balun to compensate for bond wire and package inductance and resistance.

10. The IC low noise amplifier of claim 9, wherein the balun further functions to amplify the single-ended signal.

11. The IC low noise amplifier of claim 9, wherein the line impedance matching circuit further comprises:
first capacitor coupled to receive the single-ended signal from the line and coupled to an input of the balun; and
second capacitor coupled in parallel with the balun, wherein the first and second capacitors having capacitance values that, in combination with inductance of the balun, provide a desired input impedance at a particular operating frequency range for the IC low noise amplifier and to provide gain.

12. The IC low noise amplifier of claim 11 further comprises:
the balun having the inductance and a capacitance, wherein the inductance is dominate over the capacitance at the particular operating frequency range.

* * * * *

UNITED STATES PATENT AND TRADEMARK OFFICE
CERTIFICATE OF CORRECTION

PATENT NO. : 7,796,970 B2  Page 1 of 1
APPLICATION NO. : 11/747966
DATED : September 14, 2010
INVENTOR(S) : Razieh Rofougaran et al.

It is certified that error appears in the above-identified patent and that said Letters Patent is hereby corrected as shown below:

On the Title Page Item (75) Inventors:

Replace "Rozieh Rofougaran" with --Razieh Rofougaran--

Signed and Sealed this
Twenty-fourth Day of April, 2012

David J. Kappos
*Director of the United States Patent and Trademark Office*